(12) United States Patent
Hanari (10) Patent No.: US 9,722,204 B2
(45) Date of Patent: Aug. 1, 2017

(54) DISPLAY DEVICE

(71) Applicant: Japan Display Inc., Tokyo (JP)

(72) Inventor: Jun Hanari, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 14/984,905

(22) Filed: Dec. 30, 2015

(65) Prior Publication Data

US 2016/0211480 A1 Jul. 21, 2016

(30) Foreign Application Priority Data

Jan. 16, 2015 (JP) ................................. 2015-006786

(51) Int. Cl.
*H01L 29/20* (2006.01)
*H01L 51/52* (2006.01)
*H01L 27/32* (2006.01)

(52) U.S. Cl.
CPC ...... *H01L 51/5243* (2013.01); *H01L 27/3276* (2013.01); *H01L 51/5212* (2013.01); *H01L 51/5246* (2013.01)

(58) Field of Classification Search
CPC .......................... H01L 51/5243; H01L 51/5212
See application file for complete search history.

(56) References Cited

U.S. PATENT DOCUMENTS

| 7,619,258 | B2 | 11/2009 | Tsuchiya et al. |
| 9,062,852 | B2 | 6/2015 | Kim et al. |
| 9,368,058 | B2 | 6/2016 | Omata et al. |
| 9,542,888 | B2 | 1/2017 | Omata et al. |
| 2007/0114908 | A1* | 5/2007 | Chen ................. C09K 11/7701 313/493 |
| 2012/0249454 | A1* | 10/2012 | Teraguchi ............ G06F 3/0412 345/173 |
| 2012/0256203 | A1* | 10/2012 | Kim .................... H01L 51/5243 257/88 |

(Continued)

FOREIGN PATENT DOCUMENTS

| JP | 2005-164818 A | 6/2005 |
| JP | 2005-302707 A | 10/2005 |

(Continued)

OTHER PUBLICATIONS

Korean Office Action issued on May 18, 2017 for corresponding Korean Patent Application No. 10-2016-0001992 with translation.

*Primary Examiner* — Trung Q Dang
*Assistant Examiner* — Wasiul Haider
(74) *Attorney, Agent, or Firm* — Typha IP LLC (57) ABSTRACT

A display device is provided including a display region arranged with a plurality of pixels, and a first sealing region arranged in an exterior periphery part of the display region, the display region includes an individual pixel electrode arranged in each of the plurality of pixels, a common pixel electrode arranged in upper layer of the individual pixel electrode and in succession to the plurality of pixels, and a light emitting layer arranged between the individual pixel electrode and the common pixel electrode, and the first sealing region includes a sealing layer arranged on a lower layer than the common pixel electrode and a region stacked with the common pixel electrode extending from the display region, the stacked region being enclosed by the display region.

20 Claims, 10 Drawing Sheets

(56) References Cited

U.S. PATENT DOCUMENTS

| | | | | |
|---|---|---|---|---|
| 2013/0126858 A1* | 5/2013 | Boerner | | H01L 51/5237 257/40 |
| 2014/0159002 A1* | 6/2014 | Lee | | H01L 27/3246 257/40 |
| 2014/0183528 A1* | 7/2014 | Endo | | H01L 27/1255 257/43 |
| 2014/0239268 A1* | 8/2014 | Kim | | H01L 27/3246 257/40 |
| 2014/0252317 A1* | 9/2014 | Gupta | | H01L 51/5203 257/40 |
| 2014/0353601 A1* | 12/2014 | Cho | | H01L 51/5203 257/40 |
| 2014/0361316 A1* | 12/2014 | Nozawa | | H01L 51/5265 257/88 |
| 2015/0339023 A1* | 11/2015 | Park | | G06F 3/011 345/173 |
| 2015/0340413 A1* | 11/2015 | Lee | | H01L 27/1251 257/40 |
| 2016/0154261 A1* | 6/2016 | Kim | | G02F 1/1339 349/61 |

FOREIGN PATENT DOCUMENTS

| | | |
|---|---|---|
| JP | 2014-163991 A | 9/2014 |
| KR | 10-2013-0053655 A | 5/2013 |
| KR | 10-2014-0074037 A | 6/2014 |

* cited by examiner

DISPLAY DEVICE

CROSS REFERENCE TO RELATED APPLICATIONS

This application is based upon and claims the benefit of priority from the prior Japanese Patent Application No. 2015-006786, filed on Jan. 16, 2015, the entire contents of which are incorporated herein by reference.

FIELD

The present application is related to a display device. The embodiments disclosed by the present application are related to a sealing structure of a display device.

BACKGROUND

An organic electroluminescence (referred to below as "organic EL") display device is arranged with a light emitting element in each pixel and an image is displayed by individually controlling the emitted light. A light emitting element includes a structure in which a layer (referred to below as "light emitting layer") including an organic EL material is sandwiched between a pair of electrodes wherein one is an anode and the other is a cathode. In an organic EL display device, one electrode is arranged as an individual pixel electrode for each pixel and the other electrode is arranged as a common pixel electrode applied with a common potential across a plurality of pixels. The organic EL display device controls light emitted by a pixel by applying a potential of the individual pixel electrode for each pixel with respect to the potential of the common pixel electrode.

An organic EL display device has been pointed out as being vulnerable to moisture after a period of time. Pixels which do not emit light occur when the organic EL material which forms the light emitting layer deteriorates due to moisture. In an organic EL display device, display defects due to non-light emitting pixels are referred to as dark spots.

For example, a structure is disclosed in the organic EL display device in Japanese Laid Open Patent No. 2005-164818 in which a region is arranged for dividing a planarized film formed in order to cover and smooth an upper side of a substrate in order to prevent the infiltration of water to the light emitting layer. A component called a bank which sections a pixel is arranged in a pixel region of the organic EL display device. For example, a structure is disclosed in Japanese Laid Open Patent No. 2005-302707 in which an aperture part is arranged in this bank layer and water is prevented from infiltrating due the aperture part being covered by a common pixel electrode.

SUMMARY

One embodiment of a display device according to the present invention includes a display region arranged with a plurality of pixels, and a first sealing region arranged in an exterior periphery part of the display region, the display region includes an individual pixel electrode arranged in each of the plurality of pixels, a common pixel electrode arranged in upper layer of the individual pixel electrode and in succession to the plurality of pixels, and a light emitting layer arranged between the individual pixel electrode and the common pixel electrode, and the first sealing region includes a sealing layer arranged on a lower layer than the common pixel electrode and a region stacked with the common pixel electrode extending from the display region, the stacked region being enclosed by the display region.

DESCRIPTION OF EMBODIMENTS

The embodiments of the present invention are explained below while referring to the drawings. However, the present invention can be carried out using many different variations and should not be interpreted as being limited to the contents described in the embodiments exemplified below. In addition, although the width, thickness and shape etc of each component are represented schematically compare to the actual components in order to clarify the explanation, these are merely examples and should not limit an interpretation of the present invention. Furthermore, the same reference symbols are attached to the same or similar elements that have already appeared previously in the specification and each drawing and an explanation of such elements may be omitted as appropriate.

In the present specification, when certain components or regions are described as [above (or below)] other components or regions, unless specified otherwise, this includes not only being directly above [or directly below] other components or regions, but also above [or below] other components or regions, that is, other structural components may be included therebetween.

An organic EL display device includes a complex structure in which a plurality of coating films are stacked and patterned. As a result, as is the organic EL display device disclosed in the patent document 1, in the case where a light emitting layer extends from a display region, there is a problem wherein an end part the light emitting layer contacts a bank layer which includes water even if a side surface and upper surface of a planarized film are covered by a conductive film. In addition, a problem occurs wherein water encapsulated in the bank layer infiltrates the light emitting layer even if waterproof properties of a panel periphery are improved using the bank layer.

One embodiment of the present invention aims to provide a display device having a structure in which a light emitting layer is protected from both moisture infiltrating from the exterior of the display device and moisture encapsulated within a display region.

Embodiment 1

Figure 1:
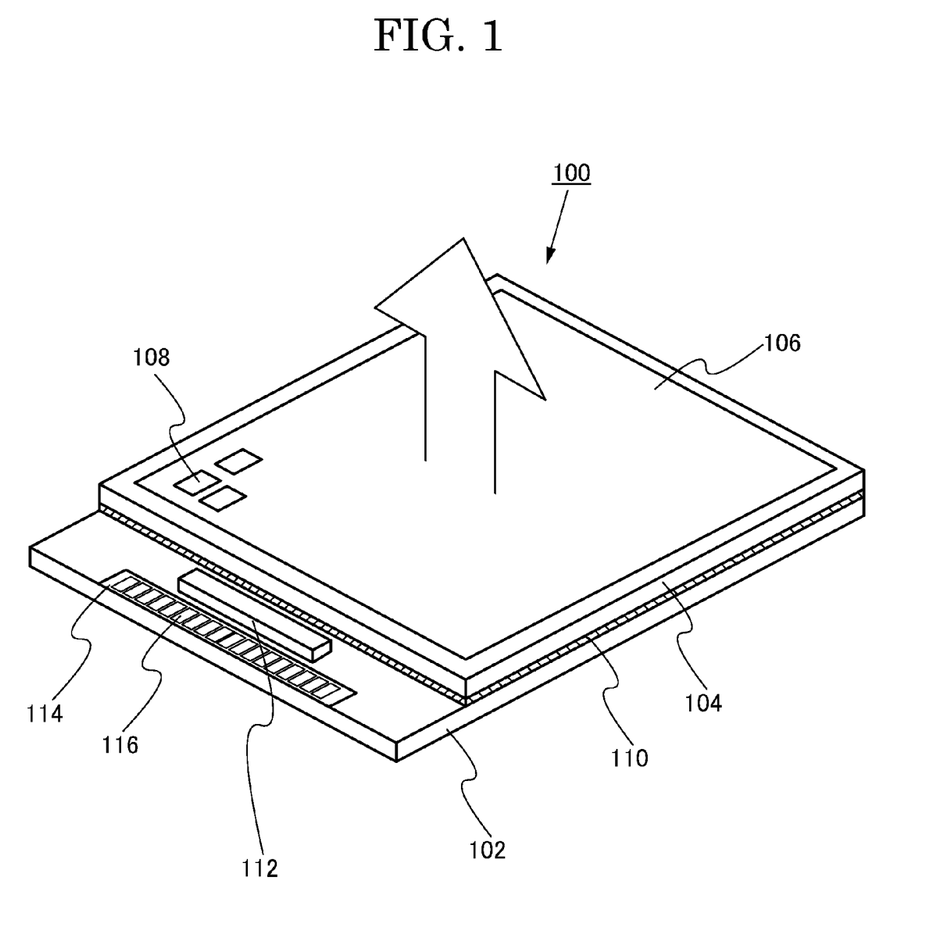
FIG. 1 is a perspective view diagram showing a structure of a display device related to one embodiment of the present invention.

The structure of a display device 100 related to the present embodiment is explained while referring to FIG. 1. The display device 100 is arranged with a display region 106 in a first substrate 102. The display region 106 is formed by arranging a plurality of pixels 108. A second substrate 104 is arranged as a sealing material on an upper surface of the display region 106. The second substrate 104 is fixed to the first substrate 102 by a third sealing region 110 which encloses the display region 106. The display region 106 formed in the first substrate 102 is sealed using a sealing material so that is not exposed to air by the second substrate 104 which is a sealing material and the third sealing region 110. Deterioration of a light emitting element 124 arranged in each pixel 108 is suppressed by adopting this type of sealing structure.

One end of the first substrate 102 is arranged with a terminal region 114. The terminal region 114 is arranged on the exterior side of the second substrate 104. The terminal region 114 is formed using a plurality of connection terminals 116. A connection terminal 116 forms a connection point between devices which output a video signal or power sources and the like, and a wiring substrate connecting a display panel. This connection point in the connection terminal 116 is exposed to the exterior. A driver circuit 112 which outputs a video signal input from the terminal region 114 to the display region 106 may be arranged in the first substrate 102.

Figure 2:
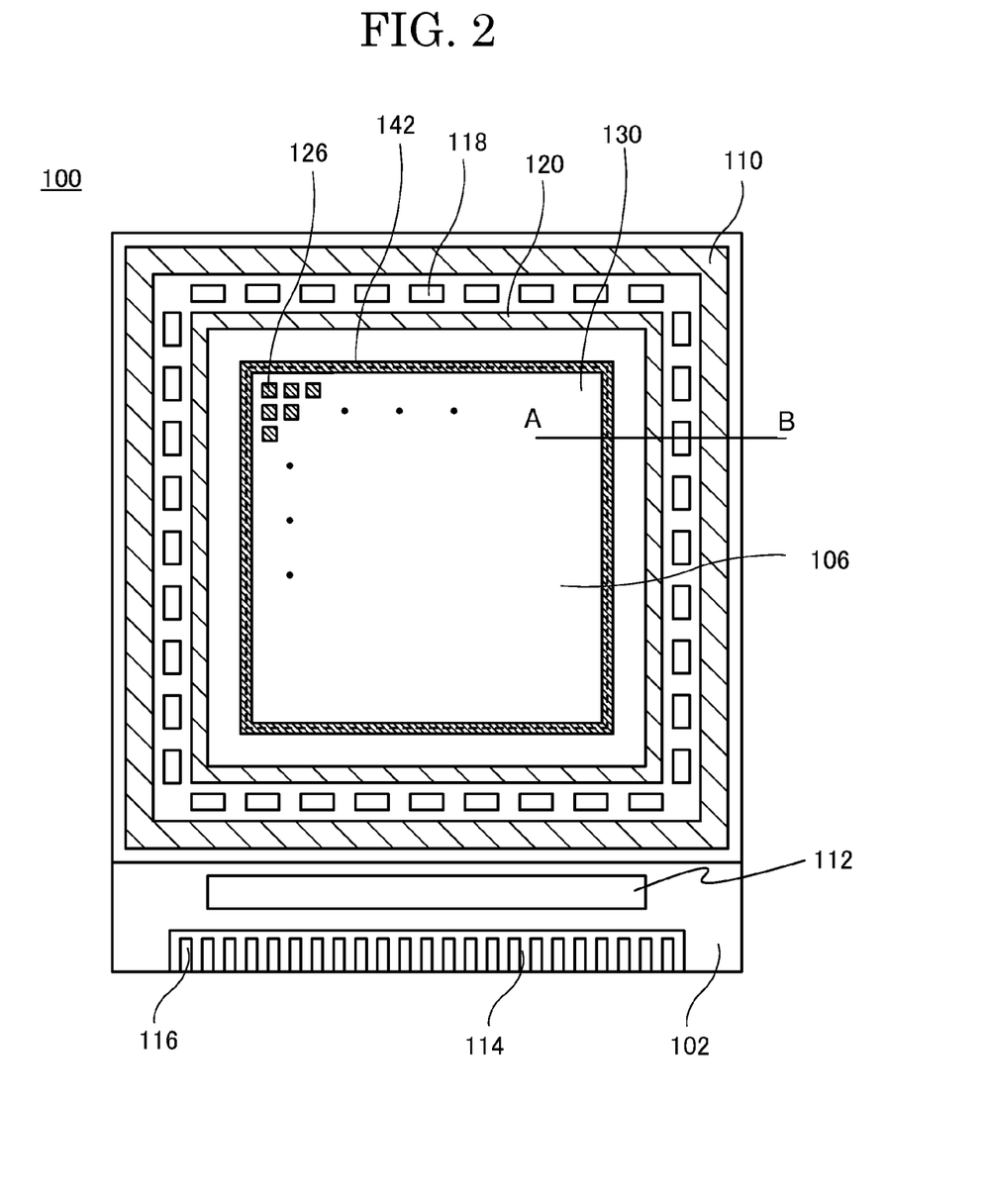
FIG. 2 is a planar view diagram showing a structure of a display device related to one embodiment of the present invention.
Figure 3:
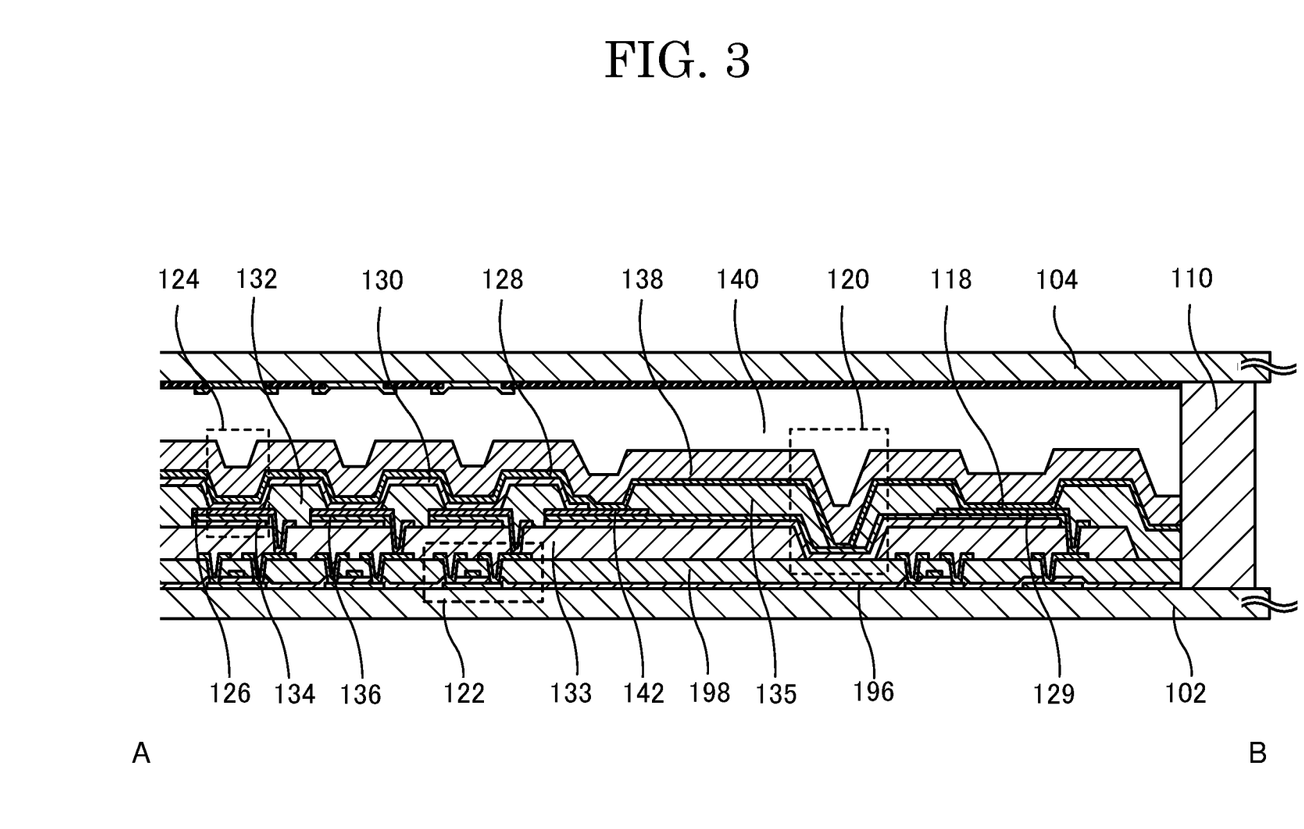
FIG. 3 is a cross-sectional diagram showing a structure of a display device related to one embodiment of the present invention.

The structure of the display device 100 related to the present embodiment is explained further while referring to FIG. 2 and FIG. 3. FIG. 2 is a planar view diagram showing the structure of the display device 100 related to the present embodiment. FIG. 3 is a cross-sectional diagram showing the structure of the display device 100 related to the present embodiment.

As is shown in FIG. 2, a plurality of pixels are arranged in a matrix shape in the display region 106 which forms a display screen above the substrate 102, and an individual pixel electrode 126 of each electrode is shown in a planar view. In addition, in the present embodiment, a sealing layer 142 is arranged so as to enclose a plurality of individual pixel electrodes 126. A plurality of cathode contacts 118 and a second sealing region 120 are arranged in a periphery edge part. A perpendicular scanning circuit or horizontal circuit which input signals to the display region 106 may be further added as other components.

FIG. 3 is a cross-sectional structure along the line A-B in the display device 100 shown in FIG. 2. As is shown in FIG. 3, each of the plurality of pixels 108 in the display region 106 includes a transistor 122 and light emitting element 124. In the case of an organic EL element, the light emitting element 124 includes a structure in which a light emitting layer 130 formed from an organic EL material is sandwiched by the individual pixel electrode 126 and a common pixel electrode 128 arranged facing the individual pixel electrode 126. The individual pixel electrode 126 is independent in each pixel and is connected to each transistor 122 respectively.

In the present embodiment, the sealing layer 142 is arranged so as to enclose the periphery of a plurality of pixels 108 arranged in a matrix shape. The sealing layer 142 and common pixel electrode 128 include a region where they contact (first sealing region), the first sealing region forms a closed periphery shape in an upper surface view and encloses the plurality of pixels 108 arranged in a matrix shape. The sealing layer 142 is arranged further to the interior than the sealing region 120. In this way, the light emitting layer 130 and bank 135 outside of the display region 106 are separated. It is preferred that he light emitting layer 130 avoid contact as much as possible with an organic element such as the bank 135 outside of the display region 106, and it is preferred that as much as possible an end part of the interior side of the sealing layer 142 is arranged in the vicinity of the most exterior periphery pixel 108. In addition, it is preferred that an end part on the exterior side of the sealing layer 142 is arranged as much as possible in the vicinity of the sealing region 120.

The sealing layer 142 may be formed above an insulation layer 136 as is shown in FIG. 3. That is, the sealing layer 142 can be formed using the same material and in the same process as the individual pixel electrode 126 in the manufacturing process of the display device. In this case, it is possible to form the sealing layer 142 just by a structural change without any large change in processes. However, the material and method for forming the sealing layer 142 are not limited to these. The sealing layer 142 may be a material with high water blocking properties, a metal material other than the individual pixel electrode 126 or an insulation material. In the case an insulation material, it is possible to use a nitride silicon film with high water blocking properties.

Since the individual pixel electrode 126 reflects light generated by the light emitting layer 130 to the common pixel electrode 128 side, it is preferred that the individual pixel electrode 126 is formed from a metal film with high reflectance. Alternatively, the individual pixel electrode 126 may be formed from a stacked structure of a metal film and transparent conductive film or a structure including a light reflective surface. Although it is possible to also form the sealing layer 142 using the same material and in the same process as the individual pixel electrode 126, the material and method used is not limited to this as mentioned previously.

A bank 132 is arranged between two adjacent pixels 108. The bank 132 is arranged so that an end part covers a periphery edge part of the individual pixel electrode 126. In the present embodiment, the bank 132 is further arranged so as to cover an end part of the sealing layer 142.

Since the bank 132 prevents shorting with the common pixel electrode 128 without the light emitting layer 130 being sufficiently covered by an end part of the individual pixel electrode 126 and insulates the space between adjacent pixels, it is preferred that the bank 132 is formed using an insulation material. For example, it is preferred to use an organic material such as polyimide or acryl or an inorganic material such as silicon oxide when forming the bank 132.

The light emitting layer 130 is arranged in common with a plurality of pixels 108 and is arranged so as to cover the bank 132 between the individual pixel electrode 126 and pixel 108. In addition, the light emitting layer 130 may extend from the display region 106 exceeding the most exterior periphery pixel 108 to cover a part of the sealing layer 142.

In the case where the light emitting layer 130 is formed from an organic EL layer for example, the light emitting layer 130 is formed using a low molecular or high molecular organic material. In the case where a low molecular organic material is used, in addition to including an organic material with light emitting properties, a hole injection layer or electron injection layer, or a hole transport layer or electron transport layer may be included to sandwich the light emitting layer 130. In the present embodiment, the light emitting layer 130 uses an element which displays white light emitting properties and a full color can be realized using a color filter.

The common pixel electrode 128 arranged above the light emitting layer 130 includes a region which contacts with the common pixel electrode 128 above the sealing layer 142 as described previously. The region has a closed periphery shape and encloses a plurality of pixels arranged in a matrix shape. In the case where the light emitting layer 130 extends as far as the sealing layer 142, the common pixel electrode 128 and sealing layer 142 covers an end part of the light emitting layer 130. By adopting this type of structure, the light emitting layer 130 and the bank 135 extending from the exterior side of the display region 106 are separated.

Since the common pixel electrode 128 allows light generated by the light emitting layer 130 to pass through, it is preferred that the common pixel electrode 128 is formed from a transparent conductive film such as ITO (indium doped with tin oxide) or IZO (indium doped with zinc oxide) having translucent properties and conduction properties. Alternatively, a metal film with a thickness which allows emitted light to pass through may be formed as the common pixel electrode 128.

It is possible to effectively block moisture from infiltrating the light emitting layer 130 by arranging a first sealing region as in the present embodiment. As a result, it is possible to improve resistance to moisture and provide a display device 100 with a high level of reliability. Furthermore, by arranging double structure in which a moisture infiltration path is blocked together with a second sealing region, it is possible to further effectively block the infiltration of moisture.

The common pixel electrode 128 is arranged in common with a plurality of pixels 108 and extends to the periphery edge part of the substrate 102. The common pixel electrode 128 and a low potential power supply wire 129 are conductive in a cathode contact 118 arranged in the periphery edge part of the substrate. As is shown in FIG. 2, the cathode contact 118 may also be arranged in a plurality of places of the periphery edge part. In addition, in the present embodiment, although the cathode contact 118 is shown being arranged in a periphery edge part, the present embodiment is not limited to this arrangement, the cathode contact 118 may also be arranged within the display region 106 or both the display region 106 and a periphery edge part.

Although not shown in the diagram, in the case where the sealing layer 142 is formed from a metal material, the low potential power source 129 may be extended to below the sealing layer 142 and arranged to conduct with the cathode contact 118. In this case, the sealing layer 124 operates as a dummy electrode. When the resistance of a wire itself or the contact resistance between wires becomes high, the potential difference between the individual pixel electrode 126 and common pixel electrode 128 becomes smaller compared to a voltage which should originally be applied due to a drop in voltage which leads to a problem where the amount of light emitted by the light emitting element 124 drops (shading). However, by adopting this type of structure, it is possible to reduce the space between the display region 106 and cathode contact 118, improve control of a potential of the common pixel electrode 128 and suppress shading.

Auxiliary electrodes 135 may be arranged below the individual pixel electrode 126 via the insulation layer 136. It is possible to form a capacitances holding a video signal by using the individual pixel electrode 126, insulation layer 136 and auxiliary electrode 134. Furthermore, if a structure in which the auxiliary electrode 134 covers a planarizing film 133 is adopted, it is possible to suppress moisture from the planarizing firm 133 from infiltrating the light emitting layer 130. Furthermore, moisture blocking properties are further improved since it is possible to completely cover the bank 135 extending from the exterior side of the display region 106 using the auxiliary electrode 13, sealing layer 142 and common pixel electrode 128.

The second sealing region 120 is arranged so as to enclose the display region 106. As can be seen from the cross-sectional view shown in FIG. 3, the bank 135 and planarizing film 133 are removed within the second sealing region 120, and the planarizing film 133 and bank 135 are divided with the second sealing region 120 as the boundary. When an organic element is used for the bank 135 or planarizing film 133, the organic element becomes a path for propagating moisture, moisture which has infiltrated from the exterior reaches as far as the light emitting element 124 which is likely to degrade the display device 100. As a result, the second sealing region 120 is arranged for opening both the bank 135 and planarizing film 133, and an organic film is divided by the interior and exterior which is effective for breaking a propagation path for moisture. An inorganic insulation film is suitable for an insulation film 198 which covers a gate insulation film 196 of the transistor 122 and a gate electrode of the transistor 122. In the sealing region 120, the insulation layer 136, auxiliary electrode 134, gate insulation film 196, insulation film 198, common pixel electrode 128 and sealing film 138 have a form so that an inorganic insulation film, metal material or organic metal compound material mutually contact. Moisture infiltration from the exterior of the sealing region 120 is prevented by adopting this structure. A material basically formed using an organic insulation film such as the bank 135 and planarizing film 133 prevents the infiltration of moisture by being removed from the sealing region 120.

The sealing film 138 is arranged above the common pixel electrode 128. It is preferred that the sealing film 138 is an insulation film which can block the infiltration of moisture. An inorganic insulation film can be used as the insulation film. The sealing film may also have a multilayer structure or a structure in which an organic insulation film is sandwiched by inorganic insulation films.

For example, in the case of using an inorganic insulation film as the insulation film, it is possible to use silicon oxide (SiOx), silicon nitride (SiNx), silicon oxynitride (SiOxNy), nitride oxide silicon (SiNxOy), aluminum oxide (AlOx), aluminum nitride (AlNx), aluminum oxynitride (AlOxNy), aluminum nitride oxide (may use a film of AlNxOy) and the like (x, y are arbitrary). A structure in which these films are stacked may also be used. It is possible to use a plasma CVD method or sputtering method as a film formation method.

In the case where an organic insulation film is used as the insulating film, it is possible to use a polyimide resin, an acrylic resin, an epoxy resin, a silicone resin, a fluorine resin and a siloxane resin and the like. It is also possible to use a stacked structure of these materials. A vapor deposition method or vapor deposition polymerization method may be used as the film forming method.

Furthermore, a stacked structure in which the inorganic insulation films and organic insulation films described above are combined may be used as the sealing film 138.

A transparent opposing substrate 104 is covered while maintaining a gap with the first substrate 102 by the third sealing region 110 in the first substrate 102. A filler 140 comprised from a transparent epoxy resin is filled in the space which is enclosed by the opposing substrate 104, third sealing region 110 and sealing film 138.

The display device 100 shown in the present embodiment has what is called a top emission type structure in which light emitted by the light emitting element 124 is emitted to the common pixel electrode 128 side. Although a top emission type structure is exemplified in the present embodiment, the present invention is not limited to a top emission type structure. It is also possible to apply a bottom emission type structure in which light is emitted to the individual pixel electrode 126 side.

The display device 100 according to the present embodiment is characterized by arranging the sealing layer 142 in the periphery of a pixel 108 in addition to the individual pixel electrode 126 which forms a pixel 108. It is possible to separate the light emitting layer 130 and bank 135 or planarizing film 133 which are organic films by covering the light emitting layer 130 which is arranged between the sealing layer 142 and common pixel electrode 128 arranged on an upper layer, block a moisture infiltration path to the light emitting layer 130, and provide the display device 100 with a high level of reliability. In addition, moisture blocking properties and reliability of the display device 100 are further improved by arranging the second sealing region 120.

Furthermore, in the manufacturing process of the display device 100 related to the present embodiment, it is possible to separate the light emitting layer 130 from bank 135 and planarizing film 133 which are organic films just using a structural change without a large process change. For example, it is possible to form the sealing layer 142 in the same process as the individual pixel electrode 126 and a deposition range of the light emitting layer 130 may be changed by changing an opening region of a film formation mask.

Modified Example 1

Figure 4:
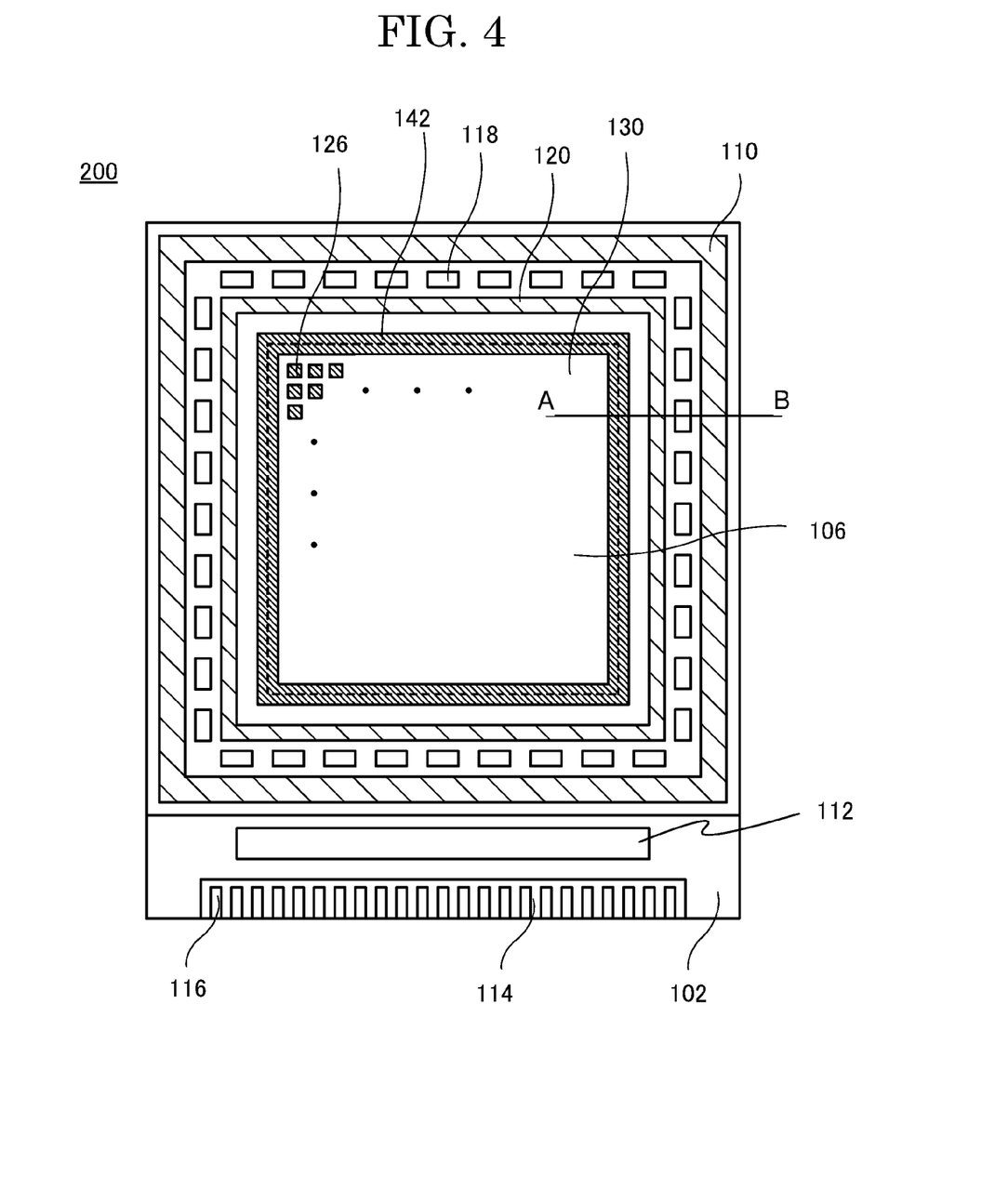
FIG. 4 is a planar view diagram showing a structure of a display device related to one embodiment of the present invention.
Figure 5:
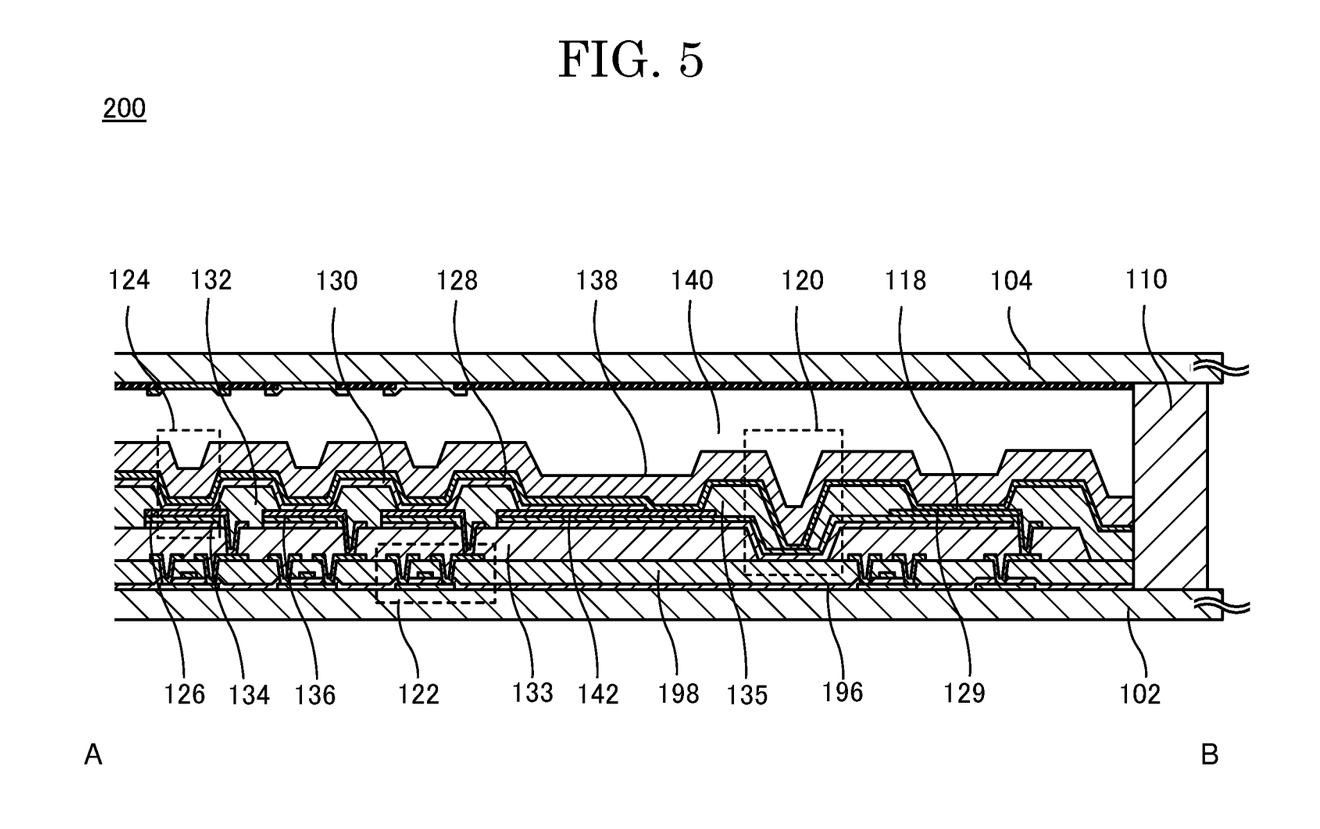
FIG. 5 is a cross sectional diagram showing a structure of a display device related to one embodiment of the present invention.

A schematic structure of a display device 200 related to a modified example of the present embodiment is explained while referring to FIG. 4 and FIG. 5. FIG. 4 is a planar view diagram showing a schematic structure of the display device 200 related to a modified example of the present embodiment. FIG. 5 is a cross-sectional diagram showing a schematic structure of the display device 200 related to a modified example of the present embodiment.

The display device 200 according to the present modified example is different only in the layout of sealing layer 142 and the layout of the light emitting layer 130 compared to the display device 100 of the present embodiment. In the display device 200 according to the present modified example, the sealing layer 142 extends more to the vicinity of the second sealing region 120 and the light emitting layer also extends in a similar manner compared to the display device 100 according to the present embodiment. The sealing layer 142 has a closed periphery shape and the width is preferred to be 250 μm or more and 500 μm or less. However, the width is preferred to be set according to the positional accuracy of the light emitting layer 130, and it is possible to set the width to a position and width which encompasses the entire range of positional variation of an end part of the light emitting layer 130. The end part of the light emitting layer 130 is preferred to extend within a region of 20 μm or more and 250 μm or less to the exterior side of the display region 106 from a pixel arranged on the outermost periphery among the plurality of pixels arranged in a matrix shape. In this way, it is possible to secure a wide design margin with respect to positional accuracy when patterning the light emitting layer 130.

Modified Example 2

Figure 6:
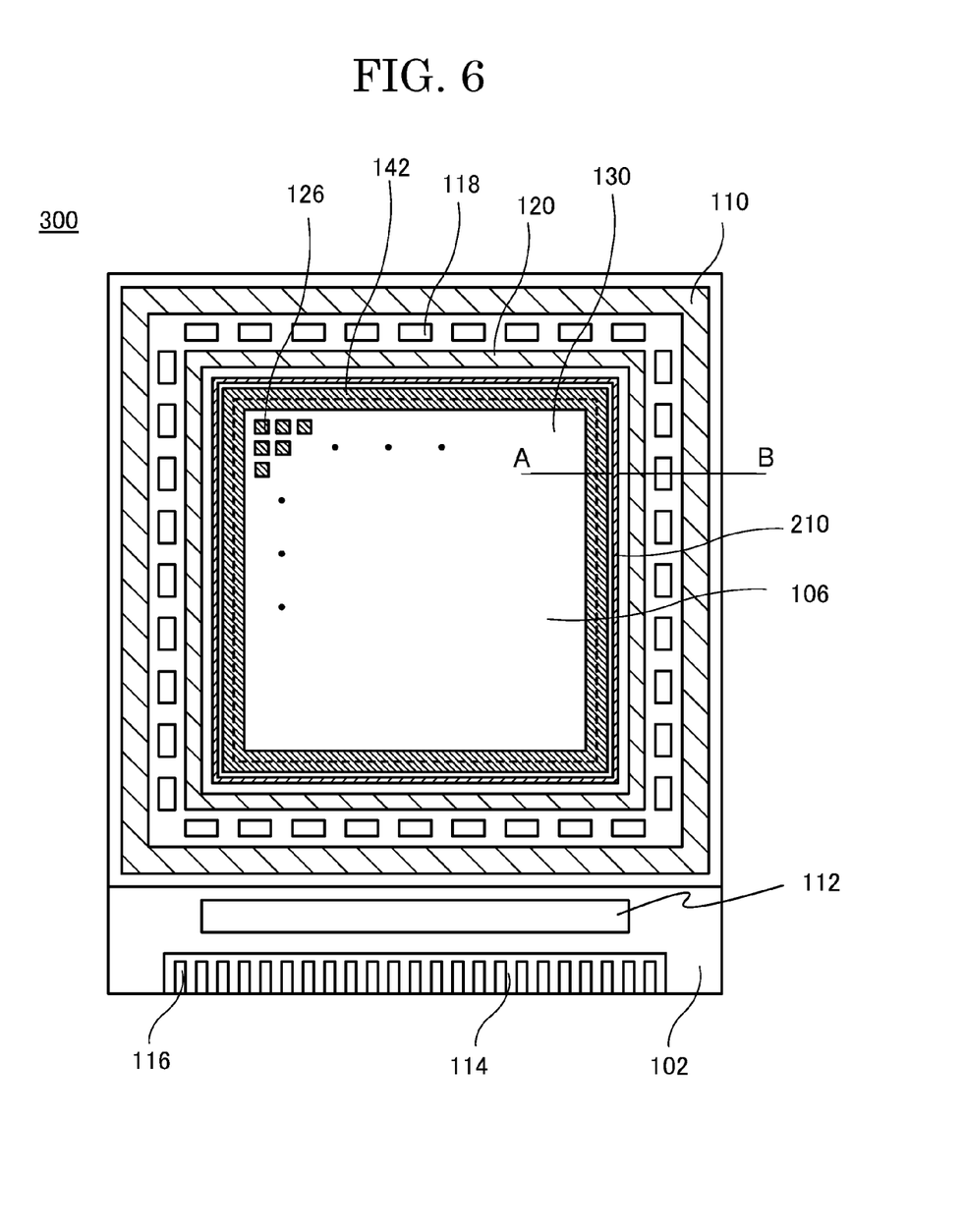
FIG. 6 is a planar view diagram showing a structure of a display device related to one embodiment of the present invention.
Figure 7:
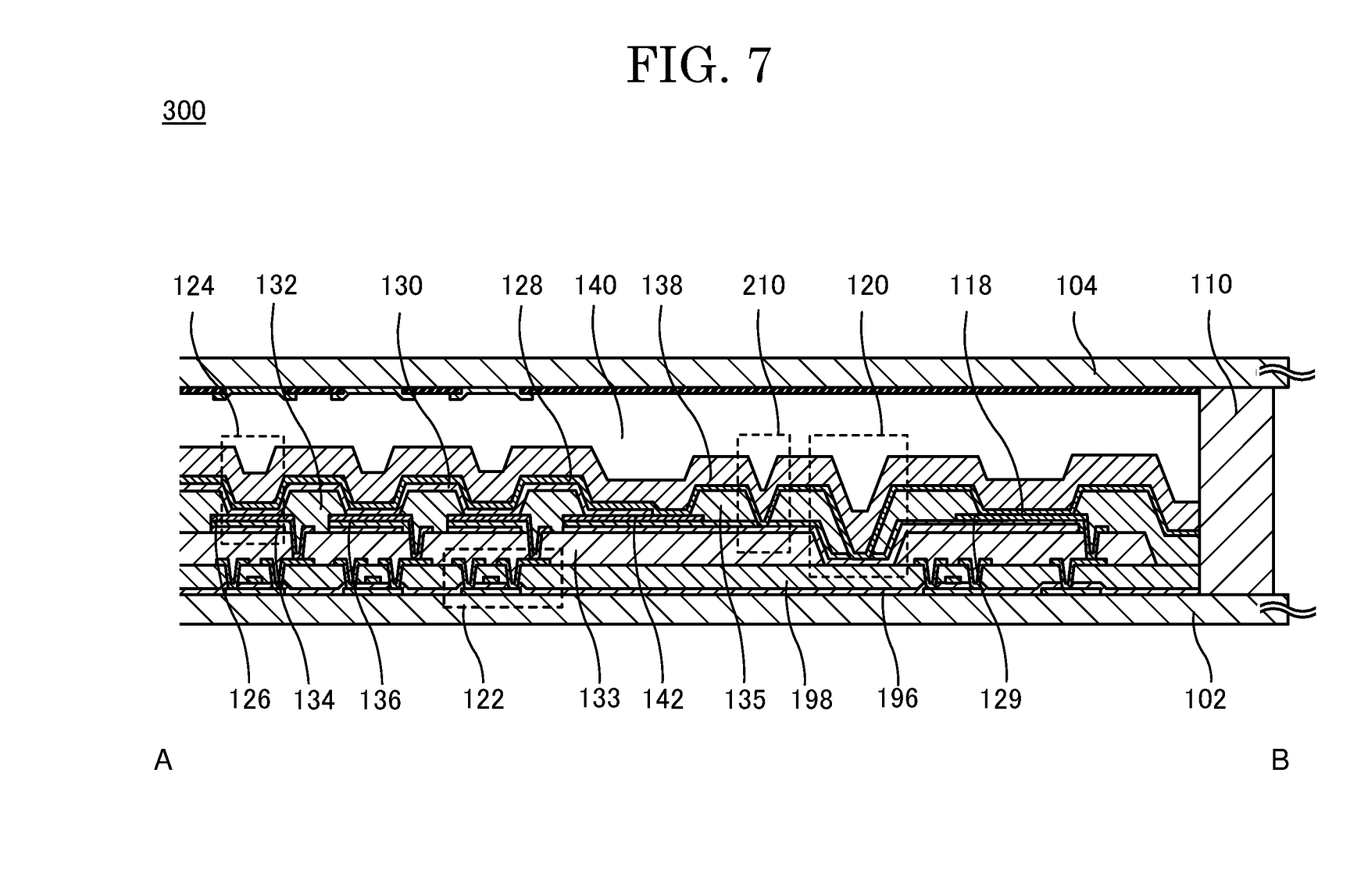
FIG. 7 is a cross sectional diagram showing a structure of a display device related to one embodiment of the present invention.

A schematic structure of a display device 300 related to a modified example of the present embodiment is explained while referring to FIG. 6 and FIG. 7. FIG. 6 is a planar view diagram showing a schematic structure of the display device 300 related to a modified example of the present embodiment. FIG. 7 is a cross-sectional diagram showing a schematic structure of the display device 300 related to a modified example of the present embodiment.

The display device 300 according to the present modified example is different compared to the display device 100 of the present embodiment in that a separation region 210 which separates the bank 135 is included between the sealing layer 142 and second sealing region 120. In this way, it is possible to break a propagation path of moisture triply, further improve moisture blocking properties and provide a display device with a high level of reliability.

Modified Example 3

Figure 8:
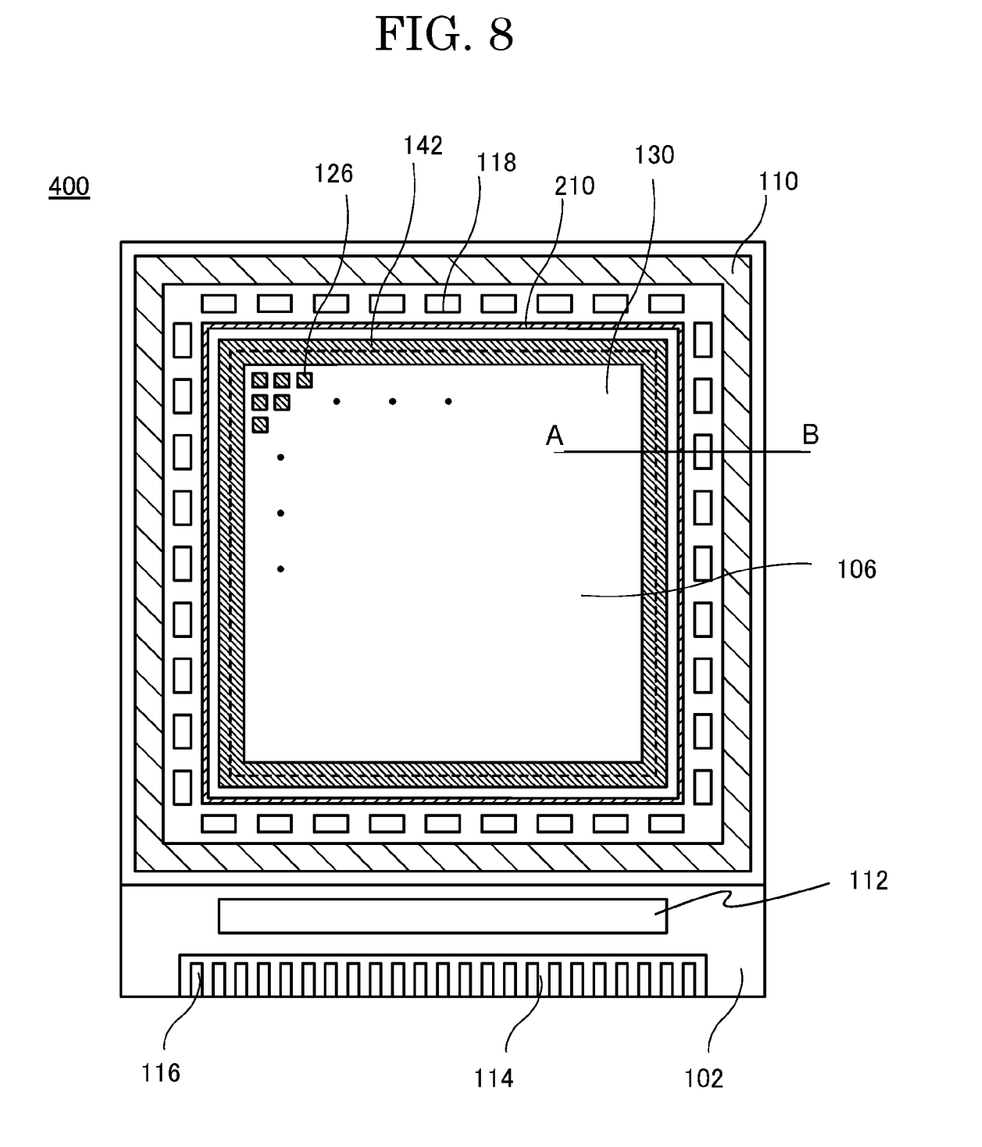
FIG. 8 is a planar view diagram showing a structure of a display device related to one embodiment of the present invention.
Figure 9:
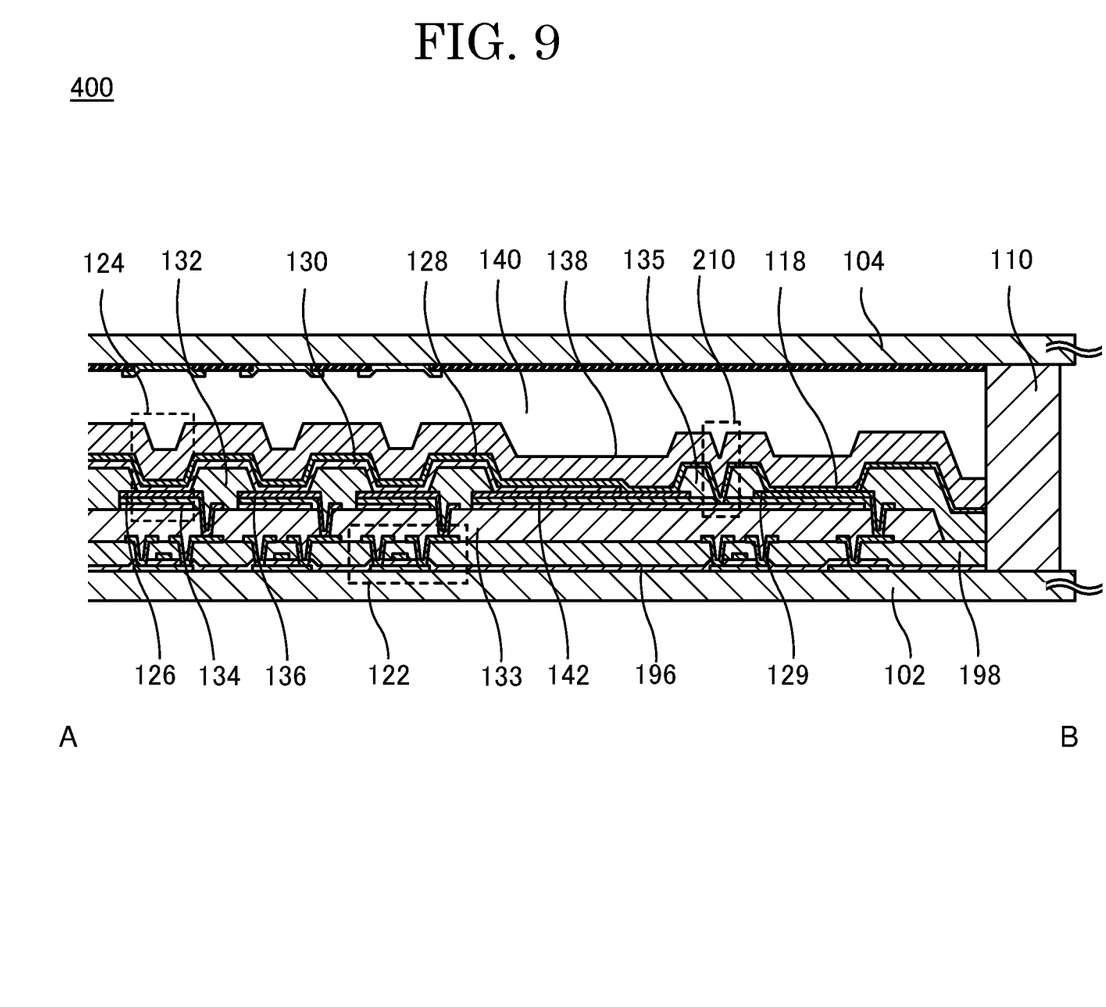
FIG. 9 is a cross sectional diagram showing a structure of a display device related to one embodiment of the present invention.

A schematic structure of a display device 400 related to a modified example of the present embodiment is explained while referring to FIG. 8 and FIG. 9. FIG. 8 is a planar view diagram showing a schematic structure of the display device 400 related to a modified example of the present embodiment. FIG. 9 is a cross-sectional diagram showing a schematic structure of the display device 400 related to a modified example of the present embodiment.

The display device 400 according to the present modified example is different to the display device 100 of the present embodiment in that it includes the second sealing region 120. Since it is possible to secure moisture blocking properties by a structure in which the light emitting layer 130 is separated from the bank 135 outside the display region 106 and the planarizing film 133 using the sealing layer 142 and common pixel electrode 128, the second sealing region 120 is not always required. In addition, it is possible to break a water propagation path by including the separation region 120 which separates the bank 135. In this way, it is possible to secure a wide display region 106 compared to the display devices 100, 200 and 300 described previously and achieve a narrow framed display device 400.

Modified Example 4

Figure 10:
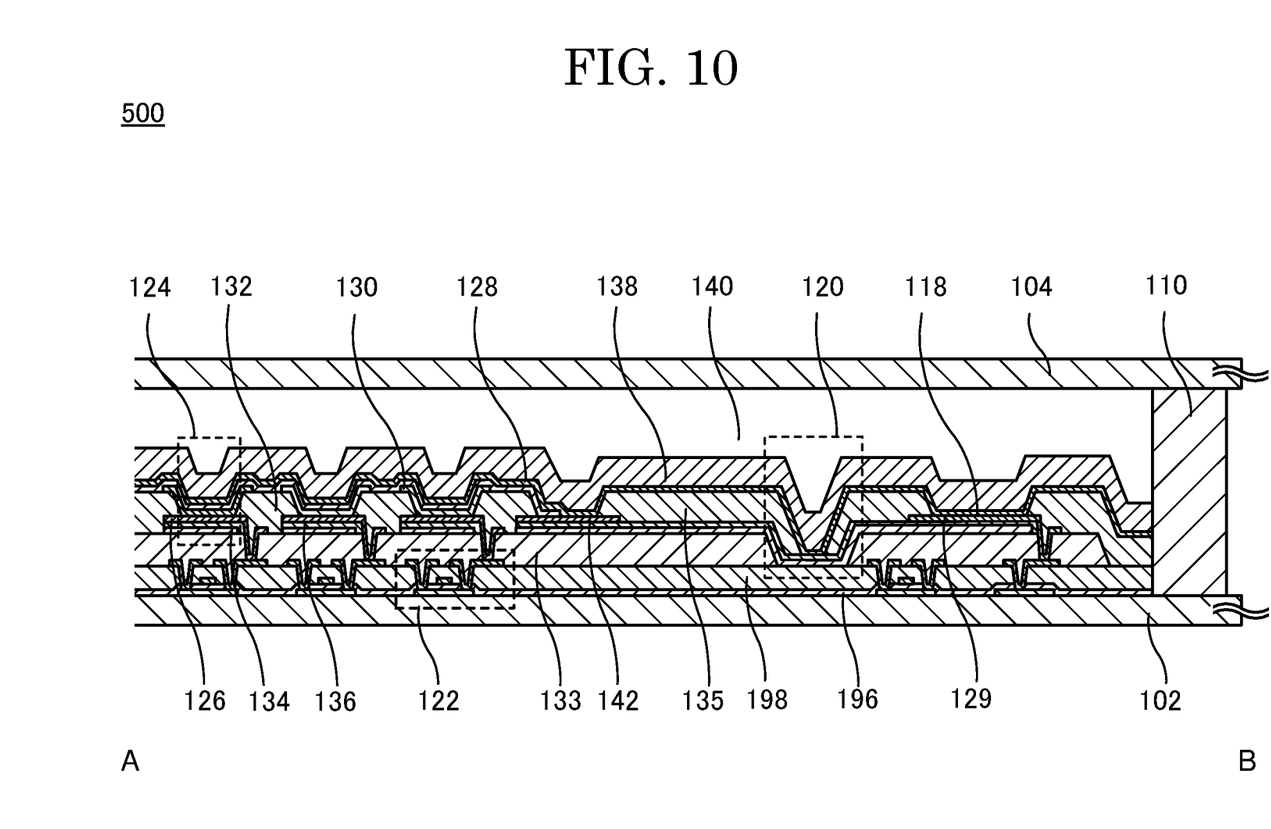
FIG. 10 is a cross sectional diagram showing a structure of a display device related to one embodiment of the present invention.

A schematic structure of a display device 500 related to a modified example of the present embodiment is explained while referring to FIG. 10. FIG. 10 is a cross-sectional diagram showing a schematic structure of the display device 500 related to a modified example of the present embodiment.

Compared to the display device 100 of the present embodiment the display device 500 related to the present modified example is different in that the structure of the light emitting layer 130 is different. The display devices 100 to 400 described above use a method for realizing a full color by arranging a light emitting layer which emits white light and a color filter. In the present modified example, an individual light emitting layer of a red light emitting layer, green light emitting layer, blue light emitting layer and white light emitting layer are coated in a sub-pixel of each pixel 108. The individual light emitting layer extends as far as above the sealing layer 142 arranged outside the display region 106. An end part of the individual light emitting layer is covered by the sealing layer 142 and common pixel electrode 128 and thereby becomes separated from the bank 135 or planarizing film 133 outside of the display region 106.

Furthermore, the present modified example is obviously not limited to the display device and the display devices 200 to 400 may be combined.

The preferred forms of the present invention were explained above using the display devices 100 to 500. However, these are merely examples and the technical scope of the present invention should not be limited to these embodiments. A person ordinarily skilled in the art could carry out various modifications without departing from the gist of the present invention. Therefore, those modifications should also be interpreted as belonging to the technical scope of the present invention.

What is claimed is:

1. A display device comprising:
    a display region arranged with a plurality of pixels;
    a first sealing region arranged in an exterior periphery part of the display region; and
    a bank arranged so as to enclose the display region, wherein:
    the display region includes an individual pixel electrode arranged in each of the plurality of pixels, a common pixel electrode over the individual pixel electrode and in succession to the plurality of pixels, and a light emitting layer arranged between the individual pixel electrode and the common pixel electrode;
    the first sealing region includes a sealing layer arranged on a lower layer than the common pixel electrode and a region stacked with the common pixel electrode extending from the display region, the stacked region enclosing the display region;
    an end of the light emitting layer and the bank are separated from each other;
    the bank is arranged so as to cover an end part of the sealing layer; and
    the common pixel electrode and the sealing layer cover the end of the light emitting layer.

2. The display device according to claim 1, wherein the light emitting layer is arranged extending to the first sealing region and overlaps a part of the sealing layer in the exterior periphery part.

3. The display device according to claim 2, wherein the sealing layer is formed from a conductive material.

4. The display device according to claim 3, wherein the sealing layer includes the same layer structure as the individual pixel electrode.

5. The display device according to claim 4 further comprising:
    a low voltage power source wire,
    wherein the sealing layer is conductive with the low voltage power source wire.

6. The display device according to claim 5 further comprising:
    an insulation layer arranged below the individual pixel electrode; and
    an auxiliary electrode arranged below the insulation layer.

7. The display device according to claim 6, wherein the common pixel electrode contacts the auxiliary electrode and a region contacting the auxiliary electrode encloses the first sealing region.

8. The display device according to claim 7 further comprising:
    a second sealing region enclosing the first sealing region.

9. The display device according to claim 1, wherein the light emitting layer includes a common light emitting layer arranged in common with the plurality of pixels.

10. The display device according to claim 1 further comprising:
    an individual light emitting layer arranged for each pixel, the individual light emitting layer being one of a red light emitting layer, green light emitting layer, blue light emitting layer, and white light emitting layer.

11. The display device according to claim 1, wherein the bank is arranged so as to cover an end part of the sealing layer.

12. The display device according to claim 1 further comprising:
    a substrate,
    wherein the sealing layer is arranged between the substrate and the common pixel electrode.

13. The display device according to claim 1 further comprising:
    a filler,
    wherein the sealing layer overlaps the filler.

14. The display device according to claim 1, wherein the stacked region includes a region where the sealing layer and the common pixel electrode contact with each other, the contact region enclosing the display region.

15. The display device according to claim 1, wherein an end of the light emitting layer is arranged in the stacked region.

16. The display device according to claim 1, wherein the light emitting layer contacts with the common electrode in the stacked region.

17. The display device according to claim 2, wherein the light emitting layer contacts with a part of the sealing layer.

18. The display device according to claim 1, wherein an end part of the light emitting layer extends within a region of 20 μm or more and 250 μm or less to the exterior side of the display region from a pixel arranged on the outermost periphery among the plurality of pixels.

19. The display device according to claim 1, wherein the sealing layer includes an inorganic material.

20. The display device according to claim 1, wherein the bank and the sealing layer partially overlap with each other.

* * * * *